United States Patent [19]
Seo et al.

[11] Patent Number: 5,071,781
[45] Date of Patent: Dec. 10, 1991

[54] METHOD FOR MANUFACTURING A SEMICONDUCTOR

[75] Inventors: Kwang-byeok Seo, Seoul; Tae-young Jeong, Hanam, both of Rep. of Korea

[73] Assignee: Samsung Electronics Co., Ltd., Kyunggi-do, Rep. of Korea

[21] Appl. No.: 592,789

[22] Filed: Oct. 4, 1990

[30] Foreign Application Priority Data

Jun. 2, 1990 [KR] Rep. of Korea ............... 90-8164

[51] Int. Cl.$^5$ ............... H01L 21/205; H01L 21/285
[52] U.S. Cl. ............................ 437/47; 437/52; 437/60; 437/233
[58] Field of Search ............... 357/23.6; 437/52, 233, 437/919, 60, 47, 203

[56] References Cited

FOREIGN PATENT DOCUMENTS 0117354  5/1989  Japan .................. 437/52
0270343 10/1989  Japan .................. 437/52

Primary Examiner—Olik Chaudhuri
Assistant Examiner—Ourmazd Ojan
Attorney, Agent, or Firm—Cushman, Darby & Cushman

[57] ABSTRACT

A method for manufacturing a BOX structured stack type capacitor of a semiconductor device is disclosed. The method comprises the steps of: defining an active region by forming a field oxide film on a semiconductor substrate of a first conductivity type; forming, on the active region, a gate electrode, a source region and a drain region of a transistor and forming a first conductive layer on a predetermined portion of the field oxide film and forming a first insulating layer on the gate electrode and the first conductive layer; forming a second insulating layer on the resultant structure; forming an opening in order to expose a portion of said source region and then depositing a second conductive layer on the entire surfaces of said second insulating layer and of the exposed substrate; forming a third insulating layer pattern of a saddle type by coating a third insulating layer on the second conductive layer; depositing a third conductive layer on the resultant structure; etching the third conductive layer disposed above the source region; removing said third insulating layer pattern and forming a first electrode pattern of a capacitor; and forming a dielectric film and a fourth conductive layer in turn on the resultant structure. In the method, the capacitance is increased by forming a storage node of a BOX structure and by using the inside and outside of the BOX structure as the effective area of the capacitor.

9 Claims, 8 Drawing Sheets

FIG. IA
(PRIOR ART)
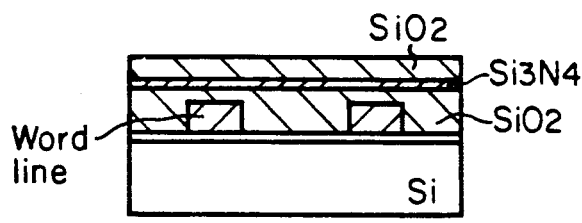
FIG. IE
(PRIOR ART)
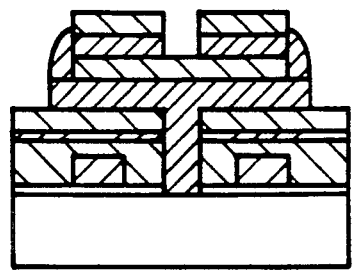
FIG. IB
(PRIOR ART)
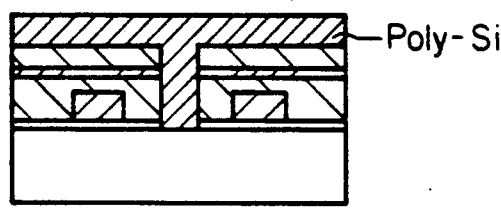
FIG. IF
(PRIOR ART)
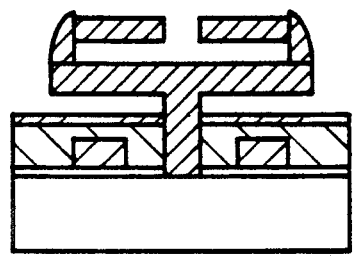
FIG. IC
(PRIOR ART)
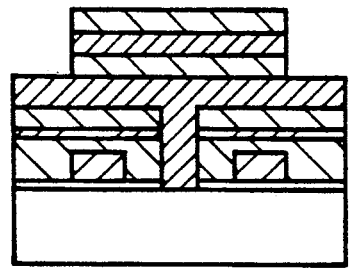
FIG. IG
(PRIOR ART)
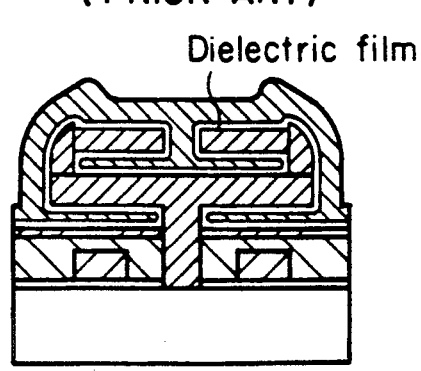
FIG. ID
(PRIOR ART)
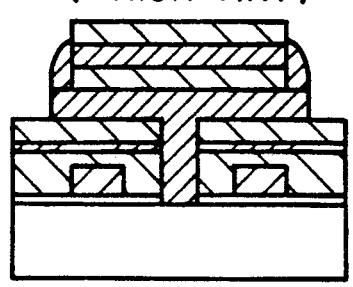

METHOD FOR MANUFACTURING A SEMICONDUCTOR

FIELD OF THE INVENTION

The present invention relates to a method for manufacturing a semiconductor and more particularly to a method for manufacturing a semiconductor which can increase the capacitance of a memory device.

BACKGROUND OF THE INVENTION

Recently, with the development of new semiconductor manufacturing processes and the extension of a memory device applications, memory devices with large capacitance have been developed. Specifically, DRAM (Dynamic Random Access Memory) has been actively developed. DRAM is effective in very large scale integration by forming one memory cell with one capacitor and one transistor.

Three dimensional capacitor structures, such as stack type capacitor cells and trench type capacitor cells, have been designed as memory cell structures for increasing packing density, instead of the prior planar type capacitor cells.

In order to obtain sufficient cell capacitance for memory cell operation by improving integration density in the 1M and 4M DRAM, a stack type capacitor construction has been widely used. However, since the size of the cell of the capacitor in 16M DRAM is no more than half the size of 4M DRAM with a conventional stack type capacitor cell construction, sufficient cell capacitance could not be obtained. Accordingly, the double-stacked storage node, the fin structure, the cylindrical cell, the BOX structure, etc., have been suggested.

FIG. 1A to FIG. 1G illustrate the process for manufacturing the STC cell (Stacked Capacitor Cell) having a BOX structure, which is disclosed in pages 141 to 144 of Ext. Abs. 21st SSDM 89, by S. Inoue, A. Nitayama, K. Hieda and F. Horiguchi.

Referring to FIG. 1A to FIG. 1G, the fabrication process of the BOX type STC cell comprises the steps of:

a) depositing $SiO_2$, $Si_3N_4$ and $SiO_2$ films on a MOS transistor (word line) formed on a substrate;

b) forming a contact hole in the substrate and depositing polysilicon film over the whole surface of the structure;

c) depositing $SiO_2$, polysilicon and $SiO_2$ films in the cited order and patterning the same;

d) covering the whole surface of the structure with polysilicon film and forming a side-wall by the etching back process;

e) forming a window for removing $SiO_2$ through a storage node;

f) removing $SiO_2$ to obtain a BOX structured storage node;

g) depositing dielectric film on the surface of the storage node and depositing polysilicon film for a cell plate.

Therefore, the BOX structured STC cell proposed by S. Inoue et al. can satisfy the cell capacitance required in 64M DRAM.

However, since the side-wall of the BOX structure is formed by the side-wall process in the aforementioned process for manufacturing the BOX STC structure, it has such disadvantages as described below.

Among these disadvantages are first, that the etching process is complicated because $SiO_2$ film, polycrystalline silicon film and $SiO_2$ film should be sequentially etched (Refer to FIG. 1C) to obtain the storage node pattern and then the etching back process (Refer to FIG. 1D) must be performed to form the side-wall. Further, $SiO_2$/polysilicon layers should be successively etched when forming a window (Refer to FIG. 1E).

The second disadvantage is that the regulation of the etching rate in the side-wall forming process is difficult. When the etching rate is low, pointed ends can occur after removing the $SiO_2$ film, as shown in FIG. 1F. And when an electric field is focused on the pointed ends, it can result in the breakdown of the dielectric film and the leakage of current and can prevent the uniform coating with the dielectric film on the surface of the storage node. Also, when the etching rate is high, the side-wall becomes thin which results in the weakening of the connection between the poly-layers of the storage node.

As a result of these disadvantages, the operation efficiency and the yield of the product are lowered.

SUMMARY OF THE INVENTION

Accordingly, it is an object of the present invention to provide a method for effectively manufacturing a BOX structured stack type capacitor in which the capacitance is increased by forming a storage node of a BOX structure and by using both the inside and outside of the BOX structure as the effective area of the capacitor.

It is another object of the present invention to provide a method for manufacturing a semiconductor device having a stacked type capacitor of the BOX structure in which the yield of a semiconductor memory device can be improved.

To accomplish the objects, the method for manufacturing the stack type capacitor comprises, in the cited order, the steps of:

defining an acting region by depositing a field oxide layer on a semiconductor substrate of a first conductivity type;

forming a gate electrode, a source region and a drain region of a transistor which constitutes a memory cell on the active region; forming a first conductive layer on a predetermined portion of the field oxide film; and forming a first insulating layer on the gate electrode and the first conductive layer;

forming a second insulating layer on the resultant structure;

forming an opening in order to expose a portion of the source region and then depositing a second conductive layer on the entire surfaces of the second insulating layer and of the exposed substrate;

forming a third insulating layer pattern of a saddle type by depositing a third insulating layer on the second conductive layer;

depositing a third conductive layer on the resultant structure;

etching the third conductive layer disposed above the source region;

removing the third insulating layer pattern and forming a first electrode pattern of a capacitor; and forming a dielectric film and a fourth conductive layer in turn on the resultant structure.

These objects and features of the present invention will become more readily apparent in the following description in connection with the accompanying drawings.

BRIEF DESCRIPTION OF THE DRAWINGS

FIG. 1A to FIG. 1G illustrate the process for manufacturing the conventional stack type capacitor.

DESCRIPTION OF THE PREFERRED EMBODIMENT OF THE INVENTION

Figure 2:
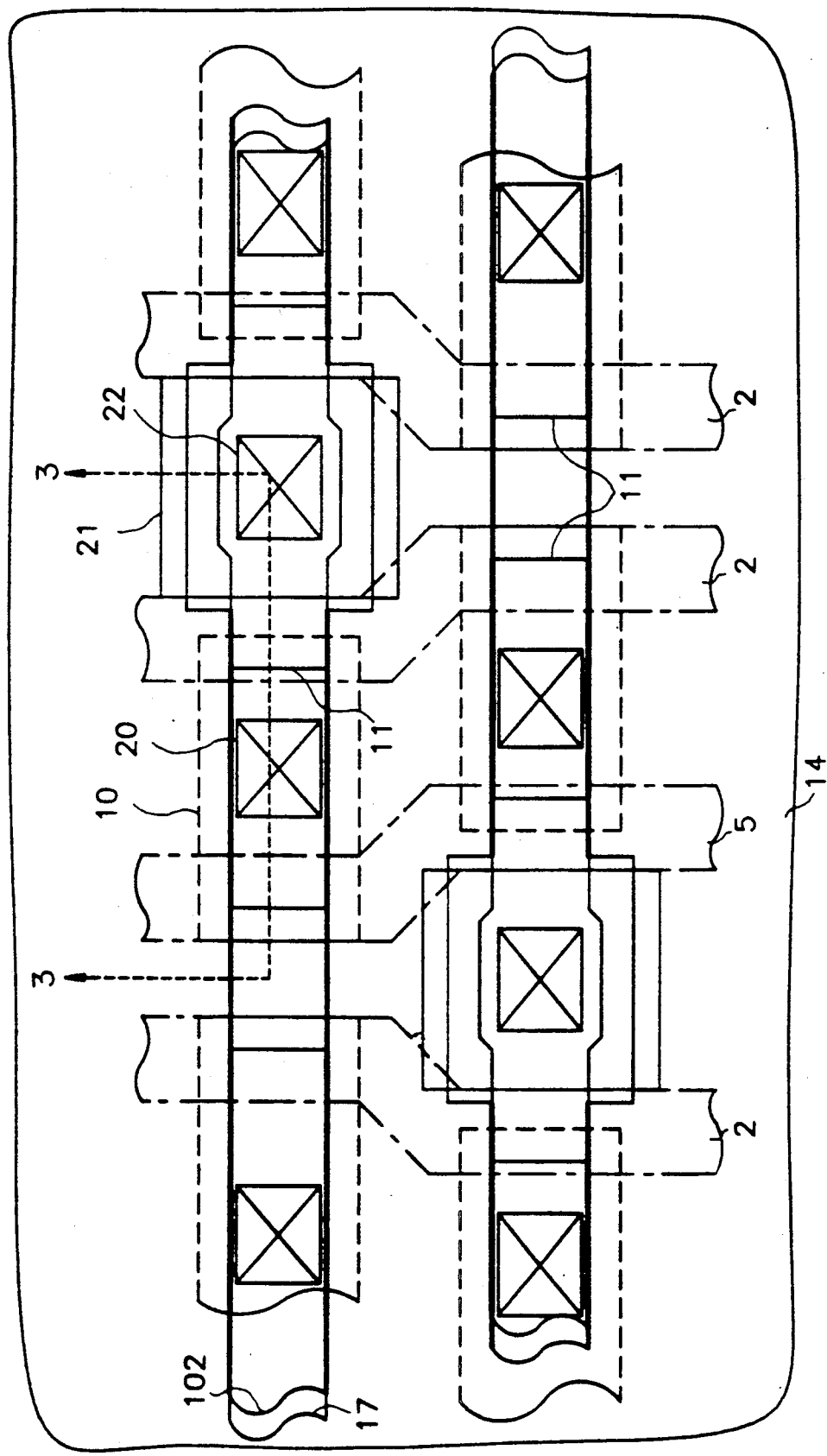
FIG. 2 is a partial plane view of a semiconductor memory device adapted to be manufactured by the method of the present invention.

FIG. 2 is a fragmentary plane view of a semiconductor memory device to be manufactured by the method of the present invention.

Referring to FIG. 2, reference numeral 102 indicates an active region and reference numerals 2 and 5 indicate word lines (a gate electrode and a first conductive layer mentioned later). Also, reference numeral 20 indicates a buried contact window for exposing a portion of a source region, 10 indicates a second conductive layer which serves as a first electrode of a capacitor by being connected with the buried contact window 20 and 11 indicates a third insulating layer pattern of a saddle type. Reference numeral 14 indicates a fourth conductive layer serving as a second electrode of the capacitor and 21 indicates a portion where the fourth conductive layer is removed. Reference numeral 22 indicates a contact window for exposing a portion of a drain region and 17 indicates a metal layer used as a bit line by its connection with the contact window 22.

Figure 3:
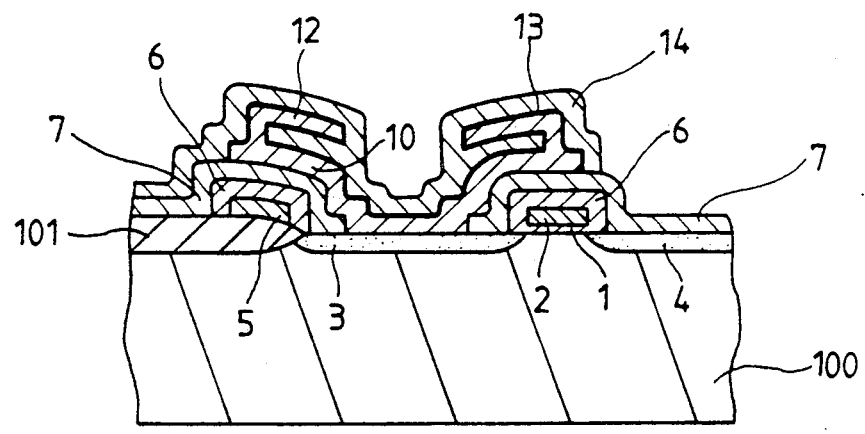
FIG. 3 is a sectional view taken along line A—A of FIG. 2, which illustrates a stack type capacitor adapted to be manufactured by the method of the present invention.

FIG. 3 is a cross-sectional view of a stack type capacitor in the semiconductor memory device shown in FIG. 2.

As shown in FIG. 2 and FIG. 3 a stack type capacitor to be manufactured by the method of the present invention is comprised of: field oxide film 101 which is selectively formed to define an active region on a semiconductor substrate 100 of a first conductivity type; a gate electrode 2 which is formed by interposing a gate oxide film 1 on the active region; a source region 3 and a drain region 4, both of which are of a second conductivity type and which are respectively formed at both sides of the gate electrode 2 and on the semiconductor substrate surface; a first conductive layer 5 which is formed on a predetermined portion of the field oxide film 101 and which is connected to the gate electrode of a memory cell disposed adjacently to the field oxide layer; insulating layers 6 and 7 which are formed on the gate electrode 2 and on the first conductive layer 5; a second conductive layer 10 which is connected with a portion of the source region 3 and is simultaneously arranged on the insulating layer 7 above the gate electrode 2 and the first conductive layer 5; a third conductive layer 12 having certain gap from the second conductive layer 10, and whose one end is connected with the second conductive layer 10 and whose pattern is arranged only above the gate electrode 2 and the first conductive layer 5; a dielectric film 13 which is formed over the surfaces of the second conductive layer 10 and the third conductive layer 12; and a fourth conductive layer 14 which is formed on the dielectric film 13.

FIG. 4A to FIG. 4I are sectional views showing one embodiment of the method for manufacturing the stack type capacitor according to the present invention.

Figure 4A:
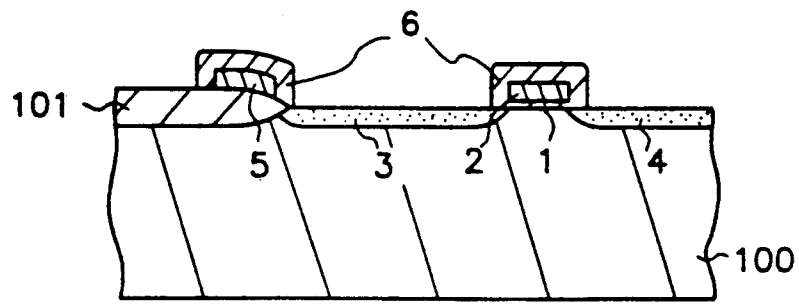
FIG. 4A to FIG. 4I illustrate one embodiment of the manufacturing process for the stack type capacitor according to the present invention.

FIG. 4A shows a process for forming a transistor on a semiconductor substrate 100. At first, an active region is defined by depositing a field oxide film 101 by a selective oxidation process on a semiconductor substrate 100 of a first conductivity type. An impurity-doped polycrystalline silicon layer serving as a gate electrode 2 of a transistor is formed on the active region by interposing a gate oxide film 1, and simultaneously a first conductive layer 5 is formed on a predetermined portion of the field oxide film 101 and connected with a gate electrode of a memory cell disposed adjacently to the field oxide layer. A first insulating layer 6 is formed in order to insulate the gate electrode 2 and the first conductive layer 5; a source region 3 and a drain region 4 are respectively formed on the semiconductor substrate surface and at both sides of the gate electrode by an ion implantation.

Figure 4B:
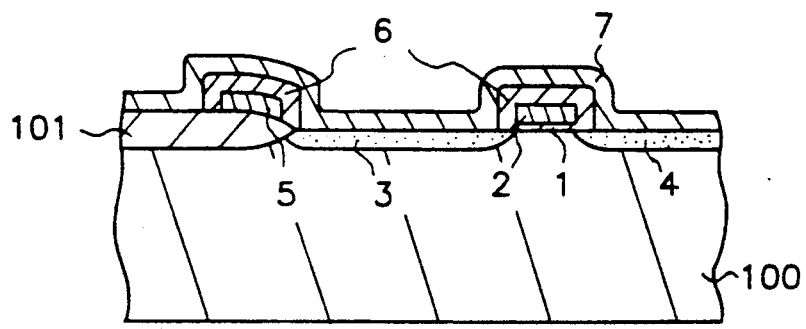

FIG. 4B shows a process for forming a second insulating layer 7. A second insulating layer having a thickness of 1000–3000Å, for example, HTO (High Temperature Oxide) layer or LTO (Low Temperature Oxide) layer is formed after performing the process of FIG. 4A.

Figure 4C:
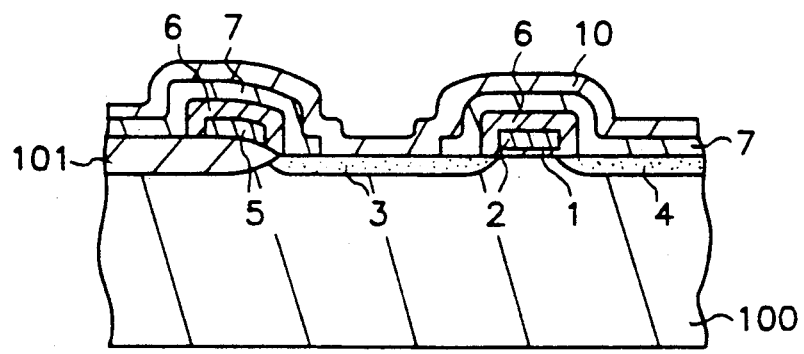

FIG. 4C shows a process for forming a second conductive layer 10 which serves as a first electrode of a capacitor. An opening is formed in order to expose a portion of the source region 3 and then a second conductive layer 10, for example, an impurity-doped second polycrystalline silicon layer, having a thickness of 1000–2000Å, which serves as a first electrode of a capacitor, is formed on the entire surfaces of the second insulating layer 7 and of the exposed substrate.

Figure 4D:
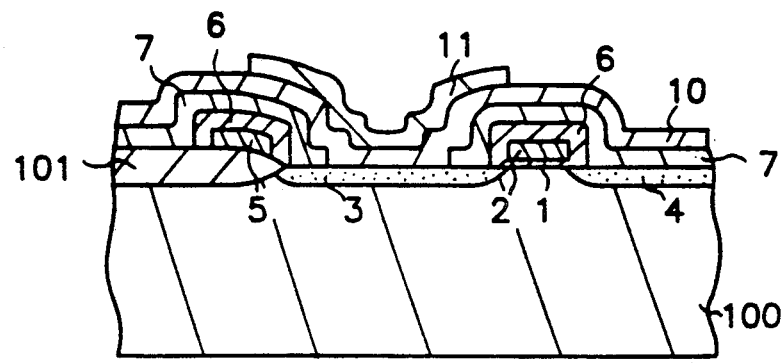

FIG. 4D shows a process for forming a third insulating layer pattern 11. A third insulating layer having a thickness of 1000–2000Å such as an HTO layer or an LTO layer is deposited on the second conductive layer 10, so that a third insulating layer pattern 11 in the form of a saddle is formed through an etching process.

Figure 4E:
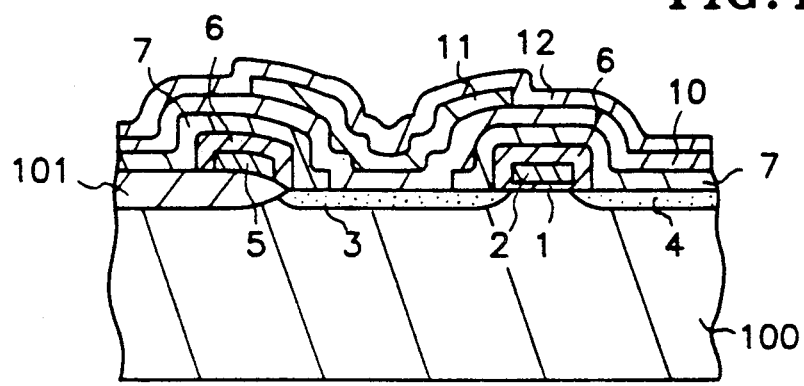

FIG. 4E shows a process for forming a third conductive layer 12 which serves as the first electrode of the capacitor. A third conductive layer 12 having a thickness of 1000–2000Å, for example, an impurity-doped third polycrystalline silicon layer is formed after the process of FIG. 4D.

Figure 4F:
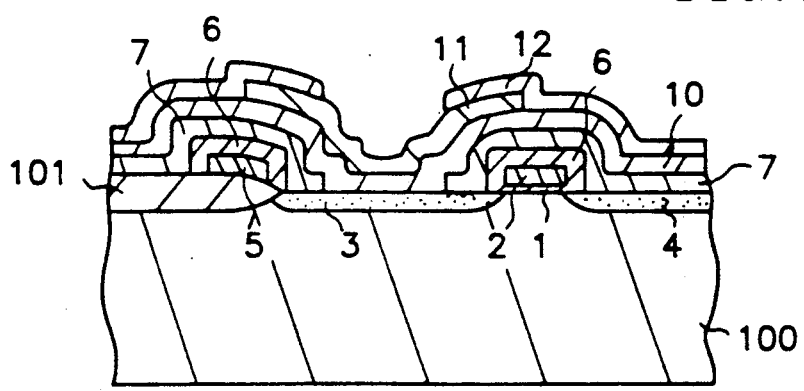

FIG. 4F shows the process for etching the third conductive layer 12. The pattern shown in FIG. 4F is formed by etching the third conductive layer disposed above the source region 3 by using a mask pattern having the same critical dimension as that of the mask pattern used in forming the opening of FIG. 4C.

Figure 4G:
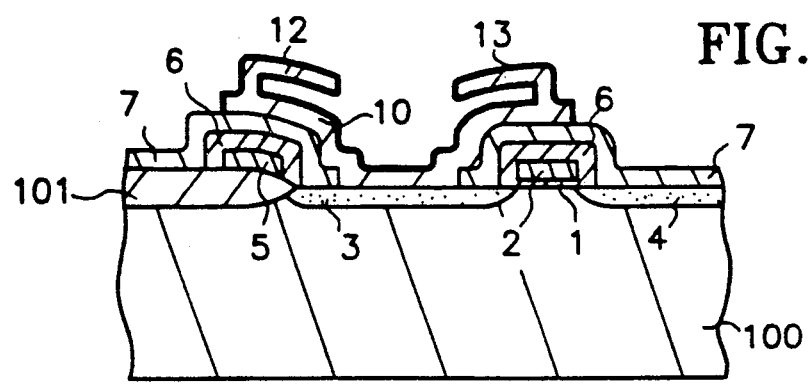

FIG. 4G shows a process for removing the third insulating layer pattern and a process for forming a first electrode pattern of the capacitor. A first electrode pattern of the capacitor, shown in FIG. 4G, is formed by removing the third insulating layer pattern exposed after the process of FIG. 4F by a wet etching method and by etching the second and the third conductive layers disposed above the gate electrode 2 and the first conductive layer 5. Because the first electrode pattern of the capacitor is formed to bend toward the source region 3 and is disposed above the gate electrode 2 and the first conductive layer 5, a bit line can be formed without difficulty after manufacturing the capacitor.

Figure 4H:
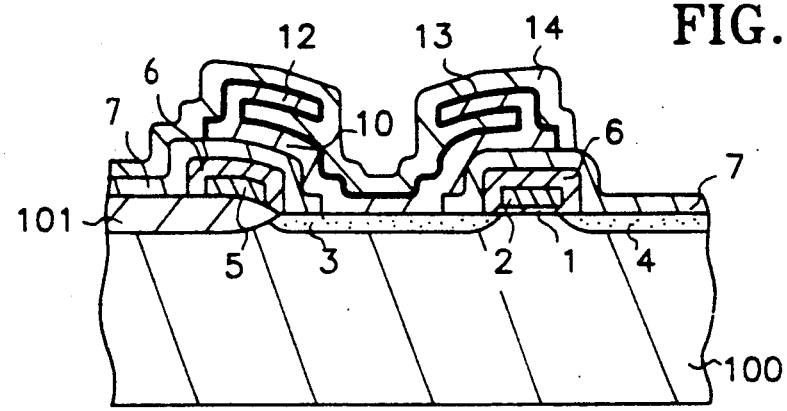

FIG. 4H shows a process for forming a dielectric film 13 and a fourth conductive layer 14 which serves as a second electrode of the capacitor. The manufacturing process for a stack type capacitor is finished by forming a dielectric film 13 having a thickness of 50–100Å over the entire upper, side and lower surfaces of the first electrode pattern of the capacitor, that is, the second conductive layer 10 and the third conductive layer 12, and by depositing a fourth conductive layer 14 having a thickness of 1000–2000Å, which is used as a second electrode of the capacitor, for example, an impurity-doped fourth polycrystalline silicon layer. In this case, the structure of the dielectric film 13 has an oxide layer structure, such as an HTO layer or an LTO layer; or an Oxide layer/Nitride layer/Oxide layer structure, the so-called ONO structure; or Nitride layer/Oxide layer structure, the so-called NO structure. Here, the capacitor cell manufactured by the present invention is particularly called a CSW (Curled Stacked and Wrapped) capacitor cell because the first electrode of the capacitor is curled toward the source region and disposed above the gate electrode and the first conductive layer, and the second electrode of the capacitor wraps the first electrode.

Figure 4I:
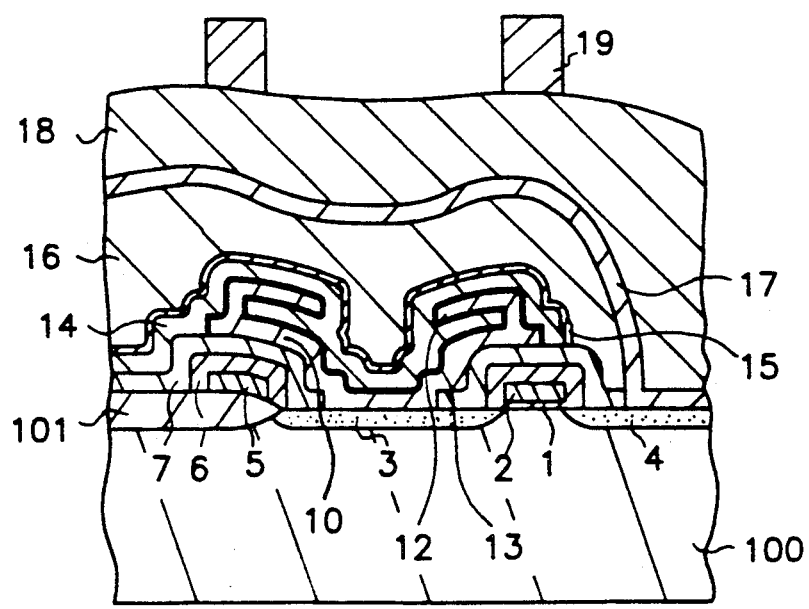

FIG. 4I shows a process for forming a fourth insulating layer 15, a first and a second planarizing layer 16 and 18, a metal layer 17 and a metal electrode 19. A fourth insulating layer 15 is formed on the surface of the fourth conductive layer 14 and following that, a first planarizing layer 16, having a thickness of 3000–5000Å, for example, BPSG (Boro-Phosphorus Silicate Glass) layer, is deposited and then is planarized by flow. Next, a DRAM having the CSW capacitor cell is completed by forming an opening in order to expose a portion of the drain region 4 by a photolithography method. Then, a metal layer 17 is formed and connected to the exposed drain region 4 through the opening. Finally, a metal electrode 19 is formed, after executing the planarizing work, again by depositing a second planarizing layer 18, for example, a BPSG layer. The metal layer 17 is used here as the bit line.

FIG. 5A to FIG. 5F illustrate another embodiment of a method for manufacturing the stack type capacitor according to the present invention.

Figure 5A:
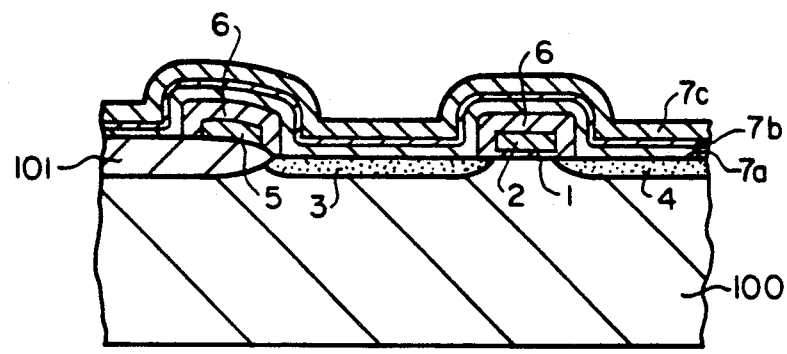
FIG. 5A to FIG. 5F illustrate another embodiment of the manufacturing process for the stack type capacitor according to the present invention.

The process preceding the process of FIG. 5A is identical with the process of FIG. 4A. FIG. 5A shows a process for forming a second insulating layer comprising a first oxide film 7a, a nitride film 7b and a second oxide film 7c. After the process of FIG. 4A, a first oxide film 7a having a thickness of about 500Å, a nitride film 7b having a thickness of about 300Å and a second oxide film 7c having a thickness of 1000Å are formed in turn.

Figure 5B:
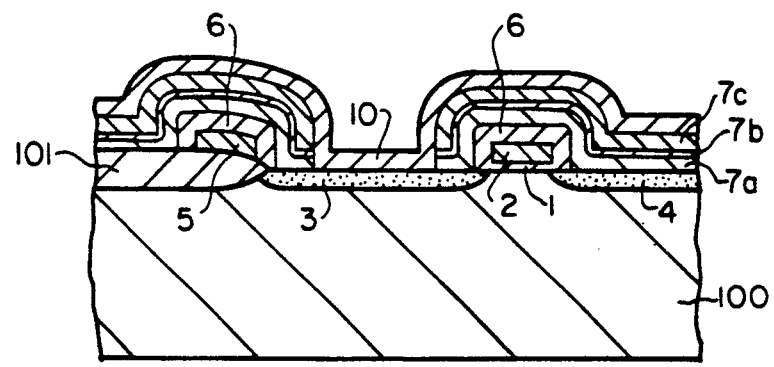

FIG. 5B shows a process for forming a second conductive layer 10 serving as a first electrode of a capacitor. An opening is formed in order to expose a portion of the source region 3 and then a second conductive layer 10, for example, an impurity-doped second polycrystalline silicon layer, having a thickness of 1000–2000Å is formed on both of the entire surfaces of the second oxide layer 7c and of the exposed substrate.

Figure 5C:
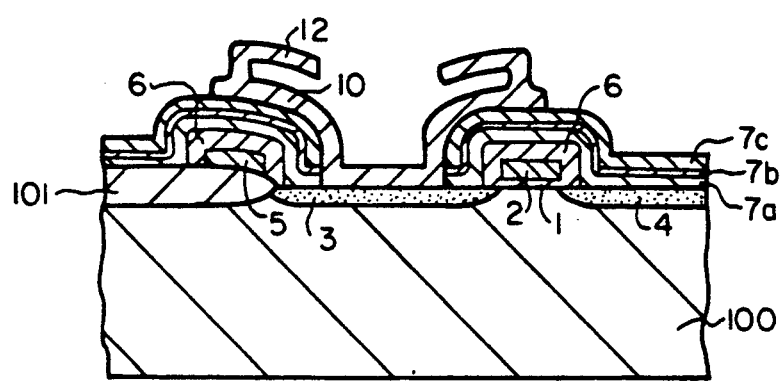

FIG. 5C shows a process for removing the third insulating layer pattern and forming a first electrode pattern of the capacitor after performing processes FIG. 4D to FIG. 4F. A first electrode pattern of the capacitor shown in FIG. 5C is formed by removing the third insulating layer pattern exposed after the process of FIG. 4F by means of a wet etching method and by etching the second and the third conductive layers disposed above the gate electrode 2 and the first conductive layer 5.

Figure 5D:
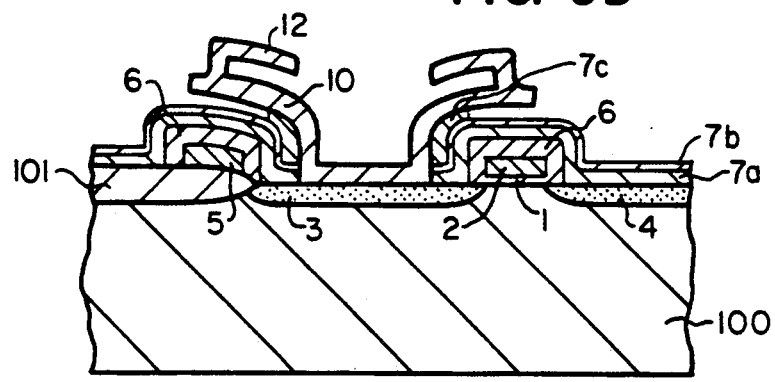

FIG. 5D shows a process for etching the second oxide film 7c. The surface area of the first electrode pattern is increased by removing either a portion of or all of the second oxide film located below the second conductive layer 10 of the first electrode pattern by means of a wet etching method by using the nitride film 7b as an etch blocking layer. Therefore, the effective area of the capacitor can be controlled according to the extent of the etching of the second oxide layer.

Figure 5E:
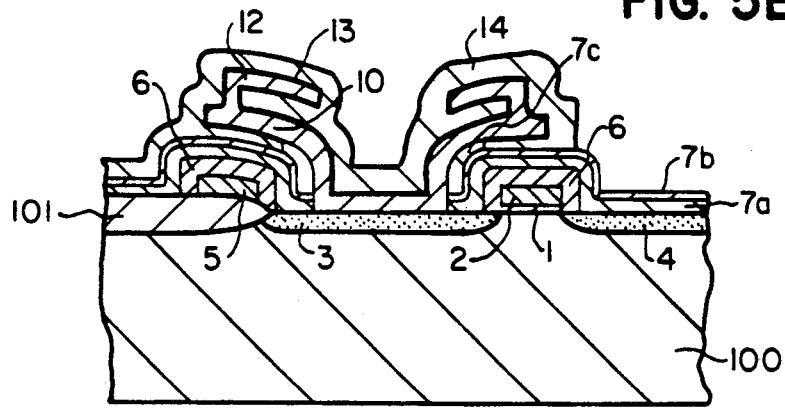

FIG. 5E shows a process for forming a dielectric film 13 and a fourth conductive layer 14 to serve as a second electrode of the capacitor. A stack type capacitor is completed, first, by depositing a dielectric film 13 having a thickness of 50–100Å over the entire upper, side and lower surfaces of the first electrode pattern of the capacitor, this first electrode pattern being the third conductive layer 12 and the second conductive layer 10 below which the second oxide layer is etched. The stack type capacitor is finally completed by depositing on the dielectric film 13 a fourth conductive layer 14, for example, an impurity-doped fourth polycrystalline silicon layer, having a thickness of 1000–2000Å, which is used as a second electrode of the capacitor. Here the dielectric film 13 has an oxide layer structure, such as an HTO layer, an LTO layer, an ONO structure, or an NO structure.

Figure 5F:
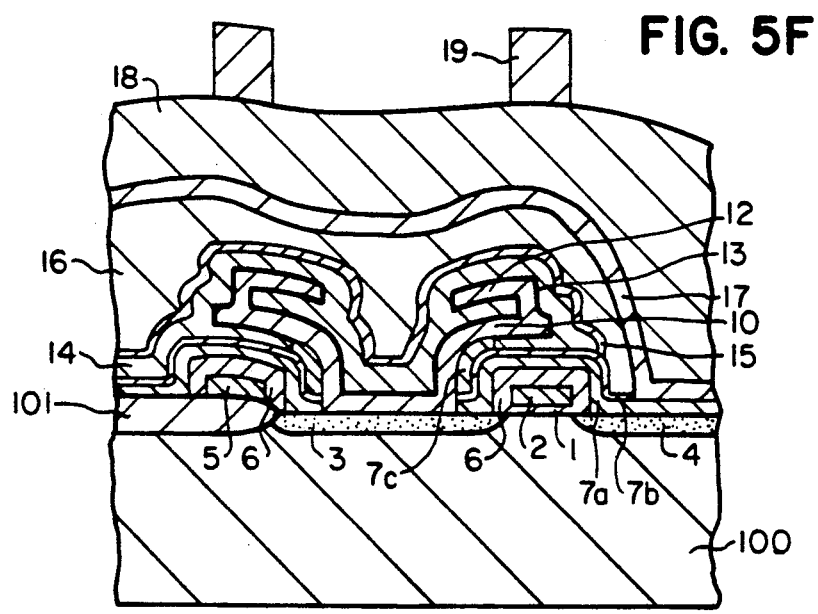

The process of FIG. 5F is identical with that of FIG. 4I.

As described above, the manufacturing method of a stack type capacitor, which has a BOX structure according to the present invention can more effectively obviate the problems encountered in the prior art due to the side-wall construction and by using the $SiO_2$ pattern of a saddle type, as compared with the manufacturing method proposed by S. Inoue et al. Specifically, since the whole etching process is carried out only for a single layer and the side-wall construction is unnecessary, the manufacturing process is not complicated and the dielectric film can be uniformly coated on the surface of the storage node, so that the operation efficiency can be improved and the yield of the product is increased.

Further, because the first electrode of the capacitor formed in the double layer is curled toward the source region above the gate electrode and the first conductive layer, difficulties induced by the step coverage in a cell when forming a bit line can be solved.

What is claimed is:

1. A method for manufacturing a semiconductor device comprising:
   a first process for defining an active region by forming a field oxide film on a semiconductor substrate of a first conductivity type;
   a second process for forming, on said active region, a gate electrode, a source region and a drain region of a transistor constituting a memory cell and forming a first conductive layer on a predetermined portion of said field oxide film and forming a first insulating layer on said gate electrode and said first conductive layer;
   a third process for forming a second insulating layer on the resultant structure;
   a fourth process for forming an opening in order to expose a portion of said source region and then depositing a second conductive layer on the entire surfaces of said second insulating layer and of the exposed substrate;

a fifth process for forming a third insulating layer pattern of a saddle type by coating a third insulating layer on said second conductive layer;

a sixth process for depositing a third conductive layer on the resultant structure;

a seventh process for etching said third conductive layer disposed above said source region;

an eighth process for removing said third insulating layer pattern and forming a first electrode pattern of a capacitor; and a ninth process for forming a dielectric film and a fourth conductive layer in turn on the resultant structure.

2. The method for manufacturing a semiconductor device as claimed in claim 1, wherein said second insulating layer in said third process is provided by in succession forming a first oxide film, a nitride film and a second oxide film in turn on the resultant structure.

3. The method for manufacturing a semiconductor device as claimed in claim 1, wherein said third insulating layer of said fifth process is an HTO layer or an LTO layer.

4. The method for manufacturing a semiconductor device as claimed in claim 3, wherein a thickness of said third insulating layer is 1000–2000Å.

5. The method for manufacturing a semiconductor device as claimed in claim 1, wherein said seventh process is performed by using a mask pattern having the same critical dimension as that of the mask pattern used in forming said opening of said fourth process.

6. The method for manufacturing a semiconductor device as claimed in claim 1, wherein said third insulating layer pattern of said eighth process is removed by a wet etching method.

7. The method for manufacturing a semiconductor device as claimed in claim 2, wherein after said eighth process said method further comprises a process for removing said second oxide layer disposed below said second conductive layer of said first electrode pattern.

8. The method for manufacturing a semiconductor device as claimed in claim 7, wherein said second oxide layer is removed by a wet etching method.

9. The method for manufacturing a semiconductor device as claimed in claim 1, wherein said dielectric film of said ninth process includes a process for forming a first oxide film over the surface of said first electrode pattern of said capacitor, a process for forming a nitride film on said first oxide film and a process for forming a second oxide film on said nitride film.

* * * * *